United States Patent
Mo et al.

(10) Patent No.: US 9,443,456 B2
(45) Date of Patent: Sep. 13, 2016

(54) LIQUID CRYSTAL ALIGNMENT TEST APPARATUS AND METHOD

(71) Applicant: SHENZHEN CHINA STAR OPTOELECTRONICS TECHNOLOGY CO., LTD., Shenzhen, Guangdong (CN)

(72) Inventors: Shengpeng Mo, Guangdong (CN); Wen-Pin Chiang, Guangdong (CN); Zhengxing Xu, Guangdong (CN)

( * ) Notice: Subject to any disclaimer, the term of this patent is extended or adjusted under 35 U.S.C. 154(b) by 0 days.

(21) Appl. No.: 14/111,800

(22) PCT Filed: Jun. 30, 2013

(86) PCT No.: PCT/CN2013/078549
§ 371 (c)(1),
(2) Date: Oct. 15, 2013

(87) PCT Pub. No.: WO2014/205857
PCT Pub. Date: Dec. 31, 2014

(65) Prior Publication Data
US 2016/0098949 A1 Apr. 7, 2016

(30) Foreign Application Priority Data
Jun. 26, 2013 (CN) .......................... 2013 1 0260939

(51) Int. Cl.
*G01R 31/26* (2014.01)
*G09G 3/00* (2006.01)
*G02F 1/13* (2006.01)
(Continued)

(52) U.S. Cl.
CPC ............... *G09G 3/006* (2013.01); *G01R 1/073* (2013.01); *G02F 1/1309* (2013.01); *G02F 1/133788* (2013.01); *G09G 3/36* (2013.01)

(58) Field of Classification Search
CPC ...................................................... G09G 3/006
USPC ............ 324/760.01, 754.07, 754.11, 762.01, 324/691; 345/88, 173
See application file for complete search history.

(56) References Cited

U.S. PATENT DOCUMENTS

| | | | | |
|---|---|---|---|---|
| 5,473,261 A | * | 12/1995 | Marumoto | G09G 3/006 324/760.01 |
| 5,639,390 A | * | 6/1997 | Iino | B23K 31/12 219/121.65 |

(Continued)

FOREIGN PATENT DOCUMENTS

| | | |
|---|---|---|
| CN | 1712975 A | 12/2005 |
| CN | 201138368 V | 10/2008 |

(Continued)

OTHER PUBLICATIONS

Liu YaLi, the International Searching Authority written comments, Apr. 2014, CN.

*Primary Examiner* — Patrick Assouad
*Assistant Examiner* — Demetrius Pretlow

(57) ABSTRACT

A liquid crystal alignment test method includes: connecting a liquid crystal array substrate to be tested with a liquid crystal alignment test apparatus; applying corresponding voltages to signal input ports of the liquid crystal array substrate via a voltage providing device and then to execute an image check for the liquid crystal array substrate; and detecting resistance values of each two signal input ports of the liquid crystal array substrate via s resistance detection device to judge whether each two of the signal input ports are short-circuited.

11 Claims, 3 Drawing Sheets

(51) Int. Cl.
*G01R 1/073* (2006.01)
*G02F 1/1337* (2006.01)
*G09G 3/36* (2006.01)

(56) References Cited

U.S. PATENT DOCUMENTS

| | | | | |
|---|---|---|---|---|
| 6,028,442 | A * | 2/2000 | Lee | G09G 3/006 |
| | | | | 324/537 |
| 6,137,300 | A | 10/2000 | Hayashida | |
| 7,616,004 | B1 * | 11/2009 | Schofield, III | G06F 11/24 |
| | | | | 324/522 |
| 2004/0239364 | A1 * | 12/2004 | Chung | G02F 1/136259 |
| | | | | 324/754.03 |
| 2006/0290371 | A1 | 12/2006 | Yang | |
| 2009/0215347 | A1 * | 8/2009 | Lee | G09G 3/006 |
| | | | | 445/3 |
| 2010/0052713 | A1 * | 3/2010 | Kunimori | G09G 3/006 |
| | | | | 324/754.01 |
| 2010/0134137 | A1 * | 6/2010 | Kida | G02F 1/1309 |
| | | | | 324/757.01 |
| 2011/0175800 | A1 * | 7/2011 | Mizumaki | G09G 3/006 |
| | | | | 345/87 |
| 2014/0159759 | A1 * | 6/2014 | Karita | G09G 3/006 |
| | | | | 324/754.21 |
| 2014/0267200 | A1 * | 9/2014 | Iwasa | G09G 3/006 |
| | | | | 345/204 |

FOREIGN PATENT DOCUMENTS

| | | |
|---|---|---|
| CN | 101661169 A | 3/2010 |
| CN | 101750785 A | 6/2010 |
| CN | 102841464 A | 12/2012 |
| CN | 103135268 A | 6/2013 |
| JP | 2000035442 A | 2/2000 |
| JP | 2004325319 A | 11/2004 |
| JP | 2013096758 A | 5/2013 |

* cited by examiner

LIQUID CRYSTAL ALIGNMENT TEST APPARATUS AND METHOD

TECHNICAL FIELD OF THE INVENTION

The present invention relates to test apparatuses, and more particularly, to a liquid crystal alignment test apparatus and a method thereof.

BACKGROUND OF THE INVENTION

Nowadays, liquid crystal display (LCD) panel are broadly used in LCD devices and LCD televisions. A usual processing of producing the LCD panel is by using an integrated substrate to cut to a number of LCD panel. For the integrated substrate, it is need to be aligned using a HVA photo-alignment method, namely, when the substrate is applied voltage, through applying ultraviolet (UV) light to irradiate the substrate to cause monomers of the substrate to reflect, then achieving the alignment. Nowadays, the HVA photo-alignment method is broadly used in thin film transistor (TFT) LCD industry. In order to guarantee the liquid crystals to form a predetermined angle under the irradiation of the UV light, an ultraviolet photo-alignment device (HVA device) is provided to apply voltage to the substrate via a power providing device to cause the liquid crystals to rotate to the predetermined angle. Usually, the edge of the substrate includes a number of signal input ports, the signal input ports includes a color film common electrode signal input port, a blue signal input port, a green signal input port, a red signal input port, an odd gate signal input port, an even gate signal input port, and an array common electrode signal input port. Usually, the UVA device applies corresponding voltages to the signal input ports of the substrate via the power providing device to execute the HVA photo-alignment. Usually, in order to guarantee the HVA photo-alignment is qualified, there is need to use an alignment test apparatus to test whether the HVA photo-alignment is qualified. Therein, the alignment test apparatus is like the HVA device and needs the voltage providing device to apply voltage to the substrate, and then determines whether the HVA photo-alignment is unqualified by check images of the substrate. However, when alignment test apparatus determines the HVA photo-alignment is unqualified, and if the unqualified HVA photo-alignment is not caused by the HVA device, there is need to turn off the alignment test apparatus. And then need to test resistance values between each two signal input ports of the substrate by a voltmeter manually, then to determine whether there is at least two signal input ports are short circuited to determine the qualified causation.

However, when the alignment test apparatus is turned on, it could not to test other substrates, and the general mode needs to test by a voltmeter manually, which wasting time.

SUMMARY OF THE INVENTION

The present invention provides a liquid crystal alignment test apparatus and method, do not need to turn off the liquid crystal alignment test apparatus which capable of testing whether the photo-alignment is qualified and testing resistance values of the signal input ports to determine the unqualified causation.

A liquid crystal alignment test apparatus, configured to test a liquid crystal array substrate has been aligned, the liquid crystal array substrate comprises a color film common electrode signal input port, a blue signal input port, a green signal input port, a red signal input port, an odd gate signal input port, an even gate signal input port, and an array common electrode signal input port setting at edges of the liquid crystal array substrate; wherein, the liquid crystal alignment test apparatus comprising: a probe tool comprising a plurality of probe ports, wherein, each probe port comprises a first probe and a second probe, the probe ports are configured to respective electrically contacted with the color film common electrode signal input port, the blue signal input port, the green signal input port, the red signal input port, the odd gate signal input port, the even gate signal input port, and the array common electrode signal input port, when the liquid crystal array substrate is being tested; a power providing device comprising a plurality of voltage output ports, wherein, the voltage output ports are respectively connected to the first probe of each probe port, the power providing device applies corresponding voltage to the color film common electrode signal input port, the blue signal input port, the green signal input port, the red signal input port, the odd gate signal input port, the even gate signal input port, and the array common electrode signal input port of the liquid crystal array substrate via the first probes of the probe ports, and then to execute an image check for the liquid crystal array substrate to judge whether the alignment of the liquid crystal array substrate is qualified; and a resistance detection device comprising a plurality of connecting ports, wherein, the connecting ports are respectively connected to the second probe of each probe port, the resistance detection device is configured to detect resistance values of each two second probes to obtain resistance values of each two of the color film common electrode signal input port, the blue signal input port, the green signal input port, the red signal input port, the odd gate signal input port, the even gate signal input port, and the array common electrode signal input port of the liquid crystal array substrate, when the image check is finished; thus judging whether there is a short-circuit between these signal input ports.

Therein, the resistance detection device comprises a programmable logic circuit (PLC) switch and a voltmeter comprising two connectors, the PLC switch is connected between the two connectors of the voltmeter and the connecting ports of the resistance detection circuit, and is configured to connect the two connectors with each two connecting ports of the voltmeter in sequence; thus making the two connectors are connected to each two second probes of the probe ports in sequence and the voltmeter detects the resistance value of each two of the color film common electrode signal input port, the blue signal input port, the green signal input port, the red signal input port, the odd gate signal input port, the even gate signal input port, and the array common electrode signal input port of the liquid crystal array substrate in sequence.

Therein, when the resistance detection device detects the resistance value of the two signal input ports is less than a certain value, such as kilo ohm level, thus indicating the two signal input ports are short-circuited.

Therein, the liquid crystal alignment test apparatus further comprises a display device and programmable logic circuits, the display device is connected to the power providing device and the resistance detection device via the programmable logic circuits.

Therein, the voltages applied to the liquid crystal array substrate via the power providing device are also transmitted to the display device to display via the programmable logic circuit, and then are provided for the user to check whether the applied voltages are correct.

Therein, the resistance value detected by the resistance detection circuit is transmitted to the display device to display via the programmable logic circuit, and then is provided to the user to judge whether the signal input ports are short-circuited.

Therein, the display device is a liquid crystal television or a liquid crystal display.

A liquid crystal alignment test method, comprising: connecting a liquid crystal array substrate to be tested with a liquid crystal alignment test apparatus, wherein, the liquid crystal array substrate comprises a plurality of signal input ports, the liquid crystal alignment test apparatus comprises a probe tool, a power providing device, and a resistance detection device; the probe tool comprises a plurality of probe ports, each probe port comprises a first probe and a second probe, the probe ports are respective electrically contacted with the signal input ports of the liquid crystal array substrate; applying corresponding voltages to the signal input ports of the liquid crystal array substrate via a voltage providing device and to execute an image check for the liquid crystal array substrate; and detecting resistance values of each two signal input ports of the liquid crystal array substrate via the resistance detection device to judge whether each two of the signal input ports are short-circuited.

Therein, the power providing device comprises a plurality of voltage output ports respectively connected to the first probe of each probe port, the step of applying corresponding voltages to the signal input ports of the liquid crystal array substrate via a voltage providing device and to execute an image check for the liquid crystal array substrate comprises: applying corresponding voltages to the signal input ports of the liquid crystal array substrate via the first probe of each probe and to execute the image check for the liquid crystal array substrate.

Therein, resistance detection device comprises a plurality of connecting ports respectively connected to the second probe of each probe port, the step of detecting resistance values of each two signal input ports of the liquid crystal array substrate via the resistance detection device comprises: detecting resistance values of each two second probes to obtain the resistance value of each two signal input ports of the liquid crystal array substrate via the resistance detection device.

Therein, the method further comprising: transmitting the resistance value detected by the resistance detection circuit to a display device to display via a programmable logic circuit.

The liquid crystal alignment test apparatus and method, do not need to turn off the liquid crystal alignment test apparatus and also capable of testing the liquid crystal alignment and testing short-circuit of signal input ports of the liquid crystal array substrate.

DETAILED DESCRIPTION OF THE PREFERRED EMBODIMENTS

Figure 1:
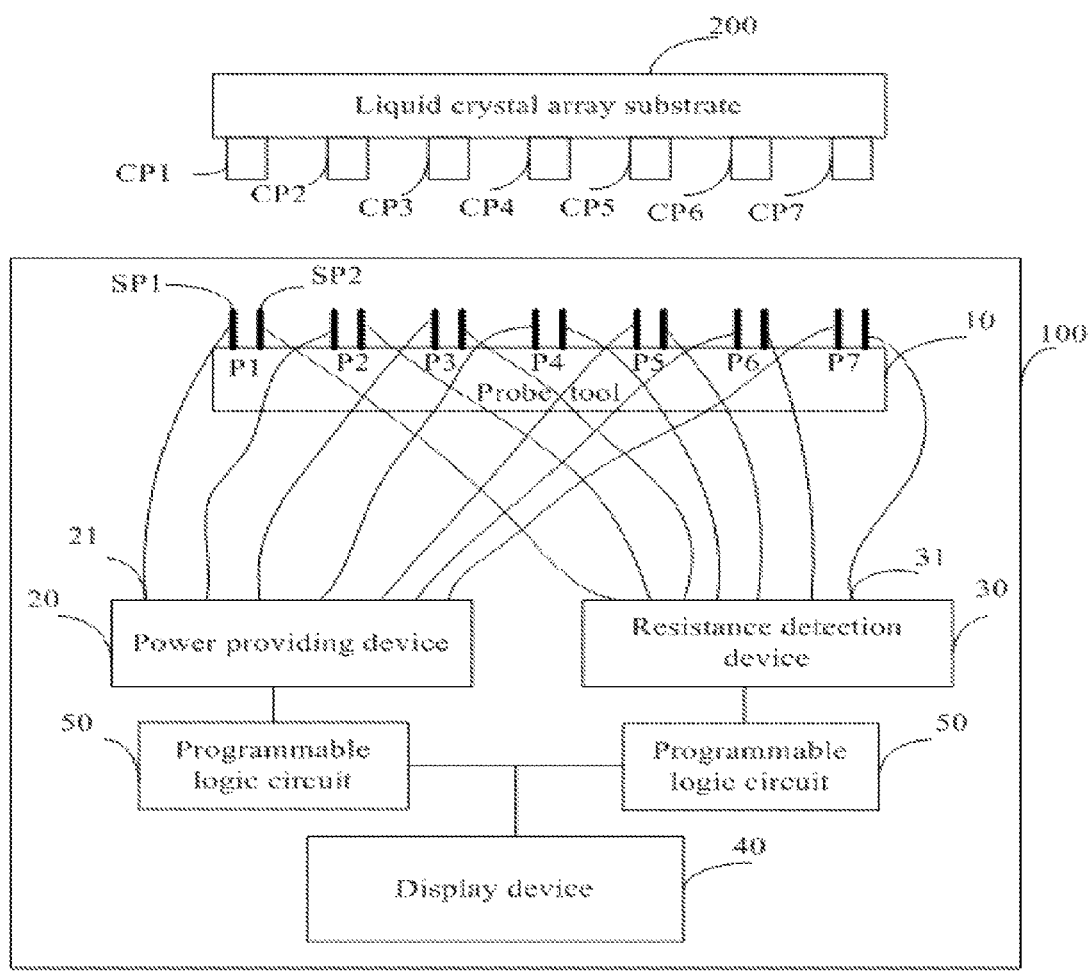
FIG. 1 is a schematic diagram of a liquid crystal alignment test apparatus of an embodiment.

Referring to FIG. 1, a liquid crystal alignment test apparatus 100 is illustrated. The liquid crystal alignment test apparatus 100 is used to test a liquid crystal array substrate 200 has been aligned.

The liquid crystal array substrate 200 includes a color film common electrode signal input port CP1, a blue signal input port CP2, a green signal input port CP3, a red signal input port CP4, an odd gate signal input port CP5, an even gate signal input port CP6, and an array common electrode signal input port CP7.

The liquid crystal alignment test apparatus 100 includes a probe tool 10, a power providing device 20, and a resistance detection device 30.

The probe tool 10 includes a number of probe ports P1~P7, each probe port includes a first probe SP1 and a second probe SP2. The probe ports P1~P7 are used to respective electrically contacted with the color film common electrode signal input port CP1, the blue signal input port CP2, the green signal input port CP3, the red signal input port CP4, the odd gate signal input port CP5, the even gate signal input port CP6, and the array common electrode signal input port CP7, when the liquid crystal array substrate 200 is being tested.

The first probe SP1 and the second probe SP2 of each probe port are used to connect to the same signal input port of the liquid crystal array substrate 200. For example, the first probe SP1 and the second probe SP2 of the probe port P1 are electrically contacted with the color film common electrode signal input port CP1. The first probe SP1 and the second probe SP2 of the probe port P2 are electrically contacted with the blue signal input port CP2. The first probe SP1 and the second probe SP3 of the probe port P3 are electrically contacted with the green signal input port CP3. The first probe SP1 and the second probe SP2 of the probe port P4 are electrically contacted with the red signal input port CP4. The first probe SP1 and the second probe SP2 of the probe port P5 are electrically contacted with the odd gate signal input port CP5. The first probe SP1 and the second probe SP2 of the probe port P6 are electrically contacted with the even gate signal input port CP6. The first probe SP1 and the second probe SP2 of the probe port P7 are electrically contacted with the array common electrode signal input port CP7.

The power providing device 20 includes a number of voltage output ports 21, the voltage output ports 21 are respectively connected to the first probe SP1 of each probe port. The power providing device 20 is electrically connected to the color film common electrode signal input port CP1, the blue signal input port CP2, the green signal input port CP3, the red signal input port CP4, the odd gate signal input port CP5, the even gate signal input port CP6, and the array common electrode signal input port CP7 of the liquid crystal array substrate 200 via the first probes SP1 of the probe ports P1~P7.

The resistance detection device 30 includes a number of connecting ports 31, the connecting ports 31 are respectively connected to the second probe SP1 of each probe port. The resistance detection device 30 is electrically connected to the color film common electrode signal input port CP1, the blue signal input port CP2, the green signal input port CP3, the red signal input port CP4, the odd gate signal input port CP5, the even gate signal input port CP6, and the array common electrode signal input port CP7 of the liquid crystal array substrate 200 via the second probes SP2 of the probe ports P1~P7.

Therein, when the liquid crystal alignment test apparatus 100 tests the liquid crystal alignment of the liquid crystal array substrate 200, through the power providing device to apply corresponding voltage to the color film common electrode signal input port CP1, the blue signal input port CP2, the green signal input port CP3, the red signal input port CP4, the odd gate signal input port CP5, the even gate signal input port CP6, and the array common electrode signal input port CP7. And then to judge whether the alignment is qualified by executing an image check for the liquid crystal array substrate 200. The image check method is the same as prior art, the detail description is omitted herein.

When the image check for the liquid crystal array substrate 200 is finished, the power providing device 30 stops applying the voltage to the liquid crystal array substrate 200.

The resistance detection device 30 is used to detect resistance values of each two second probes SP2 to obtain the resistance values of each two of the color film common electrode signal input port CP1, the blue signal input port CP2, the green signal input port CP3, the red signal input port CP4, the odd gate signal input port CP5, the even gate signal input port CP6, and the array common electrode signal input port CP7 of the liquid crystal array substrate 200, when the image check is finished. Thus judging whether there is a short-circuit between the color film common electrode signal input port CP1, the blue signal input port CP2, the green signal input port CP3, the red signal input port CP4, the odd gate signal input port CP5, the even gate signal input port CP6, and the array common electrode signal input port CP7, according to the resistance value of each two of these signal input ports. If there is the short-circuit, then determines the two signal input ports which are short circuited, which is provided to a user to repair.

Figure 2:
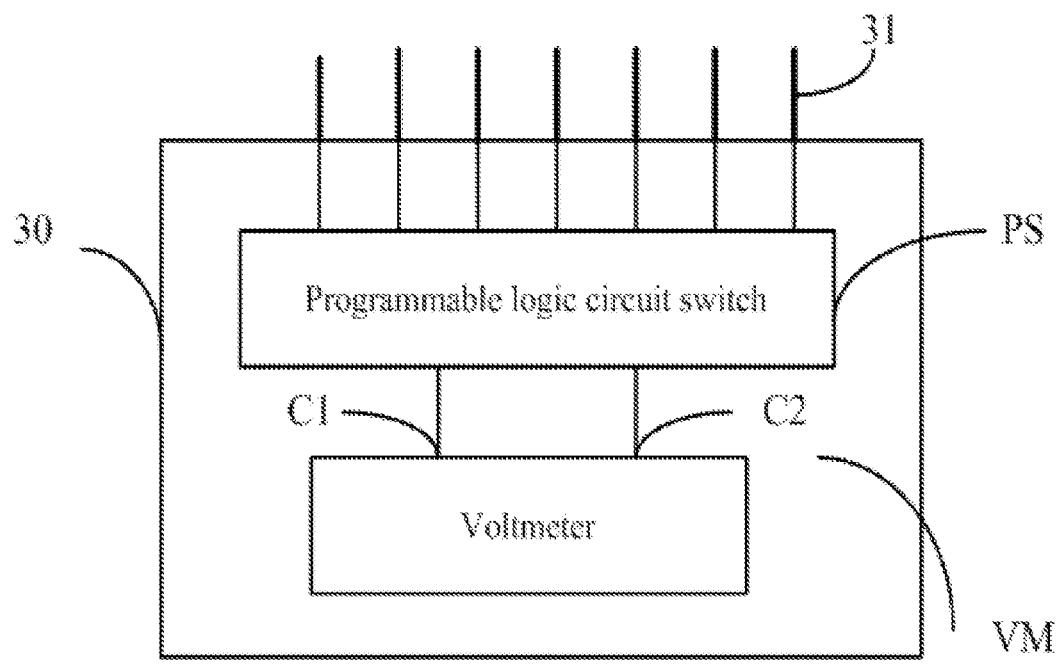
FIG. 2 is a schematic diagram of a resistance detection device of a liquid crystal alignment test apparatus of an embodiment.

Referring also to FIG. 2. In detail, the resistance detection device 30 includes a voltmeter VM including two connectors C1, C2, and a programmable logic circuit (PLC) switch PS. The PLC switch is connected between the two connectors C1 and C2, and the connecting ports 31, and is used to connect the two connectors C1, C2 with each two connecting ports 31 in sequence. Thus making the two connectors C1, C2 are connected to each two second probes SP2 of the probe ports P1~P7 in sequence. As described above, the second probes SP2 of the probe ports P1~P7 are respectively connected to the color film common electrode signal input port CP1, the blue signal input port CP2, the green signal input port CP3, the red signal input port CP4, the odd gate signal input port CP5, the even gate signal input port CP6, and the array common electrode signal input port CP7 of the liquid crystal array substrate 200. Therefore, the two connectors C1 and C2 of the two connectors C1 and C2 are respectively connected to each two of the color film common electrode signal input port CP1, the blue signal input port CP2, the green signal input port CP3, the red signal input port CP4, the odd gate signal input port CP5, the even gate signal input port CP6, and the array common electrode signal input port CP7 of the liquid crystal array substrate 200. Therefore, the resistance value detected from the voltmeter VM currently is equal to the resistance value of two second probes SP2 connected to the two connectors C1, C2 currently, and is also equal to the resistance value of the two signal input ports connected to the two second probes SP2 currently.

The voltmeter VM respectively detects the resistance value of each two of the color film common electrode signal input port CP1, the blue signal input port CP2, the green signal input port CP3, the red signal input port CP4, the odd gate signal input port CP5, the even gate signal input port CP6, and the array common electrode signal input port CP7 of the liquid crystal array substrate 200. The resistance values are provided to judge whether there is the short-circuit between the color film common electrode signal input port CP1, the blue signal input port CP2, the green signal input port CP3, the red signal input port CP4, the odd gate signal input port CP5, the even gate signal input port CP6, and the array common electrode signal input port CP7.

In detail, when the resistance value of the two signal input ports detected from the voltmeter VM is less than a certain value, such as kilo ohm level, thus indicating the two signal input ports are short-circuited.

Therein, as shown in FIG. 1, the liquid crystal alignment test apparatus 100 also includes a display device 40 and programmable logic circuits 50. The display device 40 is connected to the power providing device 20 and the resistance detection device 30 via the programmable logic circuits 50. As shown in FIG. 1, in the embodiment, the display device 40 is connected to the power providing device 20 and the resistance detection device 30 via two different programmable logic circuits 50. In another embodiment, the display device 40 is connected to the power providing device 20 and the resistance detection device 30 only via one programmable logic circuit 50.

Therein, a detection result of the resistance detection device 30, namely the resistance value detected by the voltmeter VM is transmitted to the display device 40 to display via the programmable logic circuit 50. Then provided to the user to judge whether the signal input ports are short-circuited. Obviously, the user also can read the resistance value of two signal input ports from the voltmeter VM to judge whether the two signal input ports are short-circuited.

The voltages applied to the liquid crystal array substrate 200 via the power providing device 20 is also transmitted to the display device 40 to display via the programmable logic circuit 50, which are provided for the user to check whether the applied voltages are correct.

The display device 40 can be a liquid crystal television or a liquid crystal display.

Figure 3:
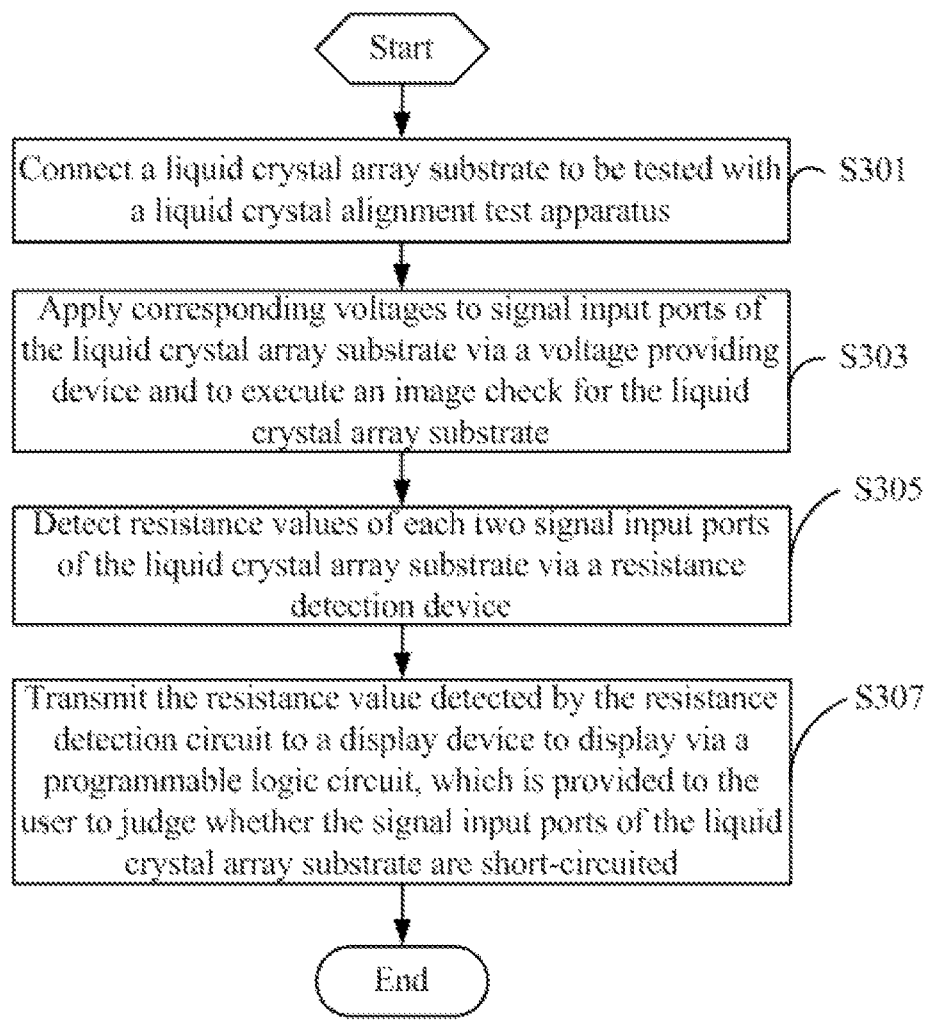
FIG. 3 is a flowchart illustrating a liquid crystal alignment test method of an embodiment.

Referring to FIG. 3, a liquid crystal alignment testing method is illustrated. At first, connecting the liquid crystal alignment test apparatus 100 with the liquid crystal array substrate 200 to be tested (S301). Therein, the probe ports P1~P7 of the probe tool 10 of the liquid crystal alignment test apparatus 100 are respective electrically contacted with the color film common electrode signal input port CP1, the blue signal input port CP2, the green signal input port CP3, the red signal input port CP4, the odd gate signal input port CP5, the even gate signal input port CP6, and the array common electrode signal input port CP7 of the liquid crystal array substrate 200.

The voltage providing device 20 applies corresponding voltages to the signal input ports of the liquid crystal array substrate 200 to execute an image check for the liquid crystal array substrate 200 (S302). Therein, the voltage providing device applies corresponding voltages to the signal input ports of the liquid crystal array substrate 200 via the first probe SP1 of each probe to execute the image check for the liquid crystal array substrate 200 (S303).

The resistance detection device 30 detects resistance values of each two signal input ports of the liquid crystal array substrate 200 (S305). In detail, the resistance detection device 30 detects resistance values of each two second probes SP2 to obtain the resistance values of each two signal input ports of the liquid crystal array substrate 200. When the resistance value of the two signal input ports is less than a certain value, that indicating the two signal input ports are short-circuited.

Transmitting the resistance value detected by the resistance detection device 30 to the display device 40 to display via the programmable logic circuit 50, which is provided to the user to judge whether the signal input ports of the liquid crystal array substrate 200 are short-circuited (S307).

In the embodiment, the method also includes: transmitting the voltages applied to the liquid crystal array substrate 200 to the display device 40 to display via the programmable logic circuit 50, which are provided for the user to check whether the applied voltages are correct.

The liquid crystal alignment test apparatus 100 and method of the present invention, do not need to turn off the liquid crystal alignment test apparatus 100, also can execute the image check and a short-circuit test of the signal input ports of the liquid crystal array substrate 200.

The present invention may be embodied in other forms without departing from the spirit or novel characteristics thereof. The embodiments disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A liquid crystal alignment test apparatus, configured to test a liquid crystal array substrate that has been aligned, the liquid crystal array substrate comprises a color film common electrode signal input port, a blue signal input port, a green signal input port, a red signal input port, an odd gate signal input port, an even gate signal input port, and an array common electrode signal input port setting at edges of the liquid crystal array substrate; wherein, the liquid crystal alignment test apparatus comprising:
    a probe tool comprising a plurality of probe ports, wherein, each probe port comprises a first probe and a second probe, the probe ports are configured to be respectively electrically contacted with the color film common electrode signal input port, the blue signal input port, the green signal input port, the red signal input port, the odd gate signal input port, the even gate signal input port, and the array common electrode signal input port, when the liquid crystal array substrate is being tested;
    a power providing device comprising a plurality of voltage output ports, wherein, the voltage output ports are respectively connected to the first probe of each probe port, the power providing device applies corresponding voltage to the color film common electrode signal input port, the blue signal input port, the green signal input port, the red signal input port, the odd gate signal input port, the even gate signal input port, and the array common electrode signal input port of the liquid crystal array substrate via the first probes of the probe ports, and then to execute an image check for the liquid crystal array substrate to judge whether the alignment of the liquid crystal array substrate is qualified; and
    a resistance detection device comprising a plurality of connecting ports, wherein, the connecting ports are respectively connected to the second probe of each probe port, the resistance detection device is configured to detect resistance values between each two second probes to obtain resistance values MAI between each two of the color film common electrode signal input port, the blue signal input port, the green signal input port, the red signal input port, the odd gate signal input port, the even gate signal input port, and the array common electrode signal input port of the liquid crystal array substrate, when the image check is finished; thus judging whether there is a short-circuit between these signal input ports.

2. A liquid crystal alignment test apparatus, configured to test a liquid crystal array substrate that has been aligned, the liquid crystal array substrate comprises a color film common electrode signal input port, a blue signal input port, a green signal input port, a red signal input port, an odd gate signal input port an even gate signal input port, and an array common electrode signal input port setting at edges of the liquid crystal array substrate: wherein, the liquid crystal alignment test apparatus comprising:
    a probe tool comprising a plurality of probe ports, wherein, each probe port comprises a first probe and a second probe, the probe ports are configured to be respectively electrically contacted with the color film common electrode signal input port, the blue signal input port, the green signal input port, the red signal input port, the odd gate signal input port, the even gate signal input port, and the array common electrode signal input port, when the liquid crystal array substrate is being tested;
    a power providing device comprising a plurality of voltage output ports, wherein, the voltage output ports are respectively connected to the first probe of each probe port, the power providing device applies corresponding voltage to the color film common electrode signal input port the blue signal input port, the green signal input port, the red signal input port, the odd gate signal input port, the even gate signal input port, and the array common electrode signal input port of the liquid crystal array substrate via the first probes of the probe ports, and then to execute an image check for the liquid crystal array substrate to judge whether the alignment of the liquid crystal array substrate is qualified; and
    a resistance detection device comprising a plurality of connecting ports, wherein, the connecting ports are respectively connected to the second probe of each probe port, the resistance detection device is configured to detect resistance values between each two second probes to obtain resistance values between each two of the color film common electrode signal input port, the blue signal input port, the green signal input port, the red signal input port, the odd gate signal input port, the even gate signal input port, and the array common electrode signal input port of the liquid crystal array substrate, when the image check is finished; thus judging whether there is a short-circuit between these signal input ports, wherein the resistance detection device comprises a programmable logic circuit (PLC) switch and a voltmeter comprising two connectors, the PLC switch is connected between the two connectors of the voltmeter and the connecting ports of the resistance detection circuit, and is configured to connect the two connectors with each two connecting ports of the voltmeter in sequence; thus making the two connectors be connected to each two of the second probes of the probe ports in sequence and the voltmeter detects the resistance value between each two of the color film common electrode signal input port, the blue signal input port, the green signal input port, the red signal input port, the odd gate signal input port, the even gate signal input port, and the array common electrode signal input port of the liquid crystal array substrate in sequence.

3. The test apparatus of claim 1 or 2, wherein when the resistance detection device detects the resistance value of the two signal input ports is less than a certain value, such as kilo ohm level, thus indicating the two signal input ports are short-circuited.

4. The test apparatus of claim 1, wherein the liquid crystal alignment test apparatus further comprises a display device and programmable logic circuits, the display device is connected to the power providing device and the resistance detection device via the programmable logic circuits.

5. The test apparatus of claim 4, wherein the voltages applied to the liquid crystal array substrate via the power providing device are also transmitted to the display device to display via the programmable logic circuit, and then are provided for the user to check whether the applied voltages are correct.

6. The test apparatus of claim 3, wherein the resistance value detected by the resistance detection circuit is transmitted to the display device to display via the programmable logic circuit, and then is provided to the user to judge whether the signal input ports are short-circuited.

7. The test apparatus of claim 4, wherein the display device is a liquid crystal television or a liquid crystal display.

8. A liquid crystal alignment test method, comprising:
   connecting a liquid crystal array substrate to be tested with a liquid crystal alignment test apparatus, wherein, the liquid crystal array substrate comprises a plurality of signal input ports, the liquid crystal alignment test apparatus comprises a probe tool, a power providing device, and a resistance detection device; the probe tool comprises a plurality of probe ports, each probe port comprises a first probe and a second probe, the probe ports are respective electrically contacted with the signal input ports of the liquid crystal array substrate;
   applying corresponding voltages to the signal input ports of the liquid crystal array substrate via a voltage providing device and to execute an image check for the liquid crystal array substrate; and
   detecting resistance values between each two signal input ports of the liquid crystal array substrate via the resistance detection device to judge whether any two of the signal input ports are short-circuited.

9. The method of claim 8, wherein the power providing device comprises a plurality of voltage output ports respectively connected to the first probe of each probe port, the step of applying corresponding voltages to the signal input ports of the liquid crystal array substrate via a voltage providing device and to execute an image check for the liquid crystal array substrate comprises:
   applying corresponding voltages to the signal input ports of the liquid crystal array substrate via the first probe of each probe and to execute the image check for the liquid crystal array substrate.

10. The method of claim 8, wherein resistance detection device comprises a plurality of connecting ports respectively connected to the second probe of each probe port, the step of detecting resistance values between each two signal input ports of the liquid crystal allay substrate via the resistance detection device comprises:
   detecting resistance values between each two second probes to obtain the resistance value between each two signal input ports of the liquid crystal array substrate via the resistance detection device.

11. The method of claim 8, further comprising:
   transmitting the resistance value detected by the resistance detection circuit to a display device to display via a programmable logic circuit.

* * * * *